(12) United States Patent
Ikegami et al.

(10) Patent No.: US 9,779,024 B2
(45) Date of Patent: Oct. 3, 2017

(54) SEMICONDUCTOR STORAGE DEVICE AND PROCESSOR SYSTEM

(71) Applicant: KABUSHIKI KAISHA TOSHIBA, Tokyo (JP)

(72) Inventors: Kazutaka Ikegami, Kanagawa (JP); Hiroki Noguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 15/051,132

(22) Filed: Feb. 23, 2016

(65) Prior Publication Data

US 2016/0247567 A1    Aug. 25, 2016

(30) Foreign Application Priority Data

Feb. 25, 2015  (JP) .................................. 2015-035539

(51) Int. Cl.
| | |
|---|---|
| *G11C 8/00* | (2006.01) |
| *G06F 12/0875* | (2016.01) |
| *G11C 11/16* | (2006.01) |
| *G06F 12/02* | (2006.01) |
| *G06F 1/26* | (2006.01) |
| *G06F 12/0868* | (2016.01) |

(52) U.S. Cl.
CPC ............ *G06F 12/0875* (2013.01); *G06F 1/26* (2013.01); *G06F 12/0238* (2013.01); *G06F 12/0868* (2013.01); *G11C 11/1675* (2013.01); *G11C 11/1697* (2013.01); *G06F 2212/202* (2013.01); *G06F 2212/214* (2013.01); *G06F 2212/452* (2013.01); *Y02B 60/1225* (2013.01)

(58) Field of Classification Search
CPC ......... G11C 7/22; G11C 7/222; G11C 7/1066; G11C 7/1072; G11C 7/1052
USPC ............. 365/233.12, 233.16, 189.14, 189.16
See application file for complete search history.

(56) References Cited

U.S. PATENT DOCUMENTS

| | | | |
|---|---|---|---|
| 4,931,997 A | * | 6/1990 | Mitsuishi ............ G06F 12/1433 365/185.04 |
| 6,256,224 B1 | | 7/2001 | Perner et al. |
| 8,130,535 B2 | | 3/2012 | Rao et al. |
| 9,176,553 B2 | | 11/2015 | Kajigaya et al. |

FOREIGN PATENT DOCUMENTS

| | | |
|---|---|---|
| JP | 2002-8368 | 1/2002 |
| JP | 2012-94201 | 5/2012 |
| JP | 2014-22681 | 2/2014 |
| JP | 2015-170202 | 9/2015 |
| WO | WO 2015/133643 | 9/2015 |

* cited by examiner

*Primary Examiner* — Son Dinh
(74) *Attorney, Agent, or Firm* — Finnegan, Henderson, Farabow, Garrett & Dunner, L.L.P.

(57) ABSTRACT

A semiconductor storage device has a non-volatile memory, a memory controller to carry out write processing to the non-volatile memory using a write pulse, and a write pulse controller to select one of a first write mode for writing to the non-volatile memory and a second write mode for writing to the non-volatile memory with higher electric power consumption than the first write mode at higher speed than the first write mode and, when the first write mode is selected, set a pulse width of the write pulse such that the pulse width is shorter than one cycle of a clock signal used to control access to the non-volatile memory,

20 Claims, 15 Drawing Sheets

SEMICONDUCTOR STORAGE DEVICE AND PROCESSOR SYSTEM

CROSS REFERENCE TO RELATED APPLICATIONS

This application is based upon and claims the benefit of priority from the prior Japanese Patent Application No. 2015-35539, filed on Feb. 25, 2015, the entire contents of which are incorporated herein by reference.

FIELD

Embodiments according to the present invention relate to a semiconductor storage device and a processor system.

BACKGROUND.

Dynamic voltage frequency scaling (DVFS) technique has been known as a technique for reducing electric power of a processor. The DVFS technique is a technique that raises or lowers an operating voltage depending on a load of the processor. The operating voltage is raised in a case where the load of the processor is high to increase a clock frequency of the processor, thereby obtaining high-speed processing. On the other hand, the voltage is lowered in a case where the load thereof is low to decrease the clock frequency, thereby reducing electric power consumption.

It has been known that, when the DVFS technique is applied to a memory circuit such as a dynamic random access memory (DRAM) or a magnetoresistive RAM (MRAM) to link a voltage supplied to the memory circuit to a voltage supplied to the processor, there is a risk of reducing an operating margin or causing a defective operation. In order to avoid this problem, an approach is also employed that a voltage supplied to a processor core is raised or lowered depending on the load using the DVFS technique, while a voltage supplied to the memory circuit is kept constant regardless of the degree of the load.

A write voltage of the MRAM is known to abruptly rise in a case where a write time is shortened. As described above, in a case where the write voltage to the MRAM is set so as to be always constant regardless of an operating state of an arithmetic core, the write voltage is always kept raised in accordance with the arithmetic core in a high-load state, Consequently, the write voltage remains high even after the arithmetic core has shifted to a light-load state, resulting in an increase in the electric power consumption of the MRAM.

DETAILED DESCRIPTION,

According to one embodiment of a semiconductor storage device has a non-volatile memory, a memory controller to carry out write processing to the non-volatile memory using a write pulse, and a write pulse controller to select one of a first write mode for writing to the non-volatile memory and a second write mode for writing to the non-volatile memory with higher electric power consumption than the first write mode at higher speed than the first write mode and, when the first write mode is selected, set a pulse width of the write pulse such that the pulse width is shorter than one cycle of a clock signal used to control access to the non-volatile memory.

First Embodiment

Figure 1:
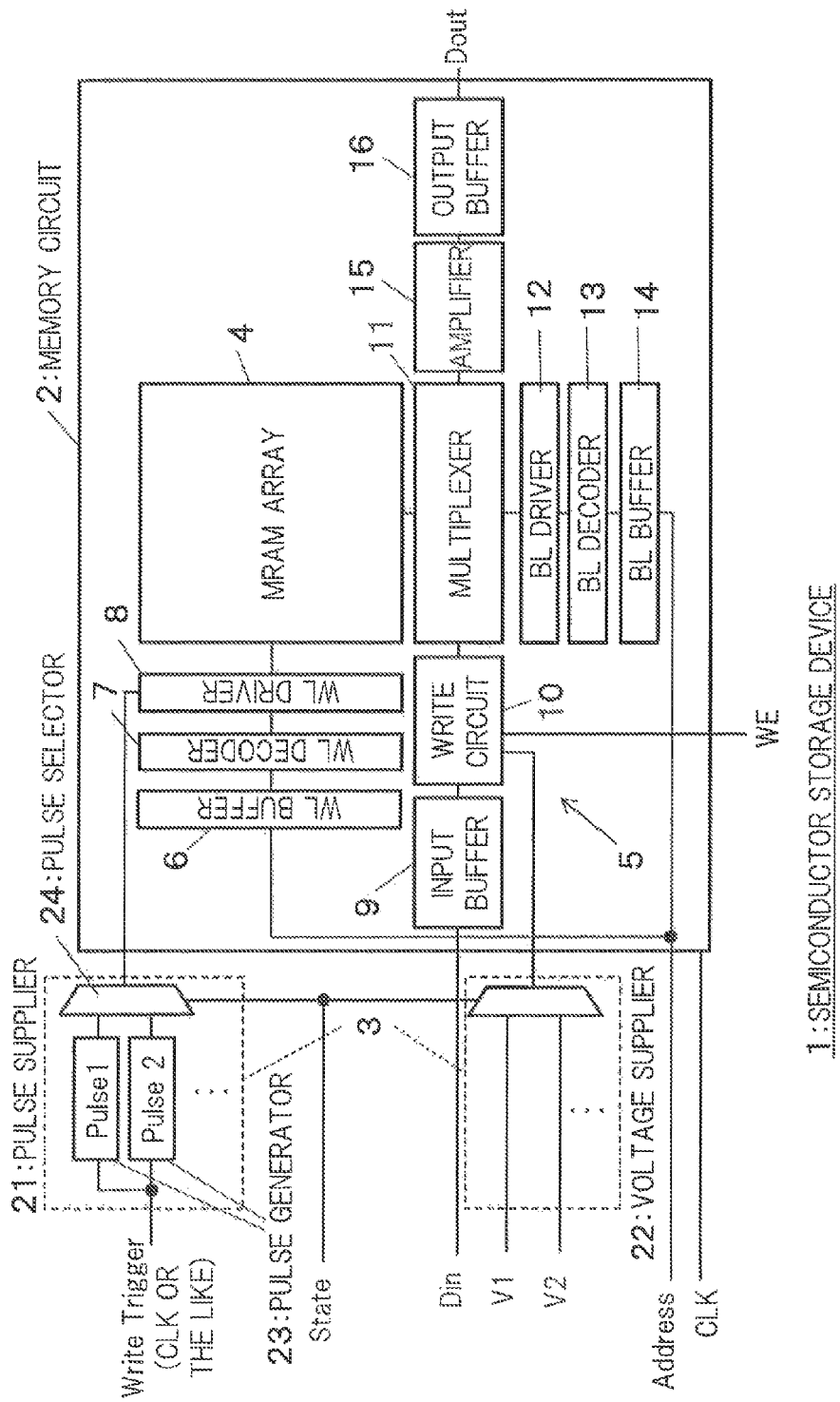
FIG. 1 is a block diagram illustrating a schematic configuration of a semiconductor storage device 1 according to a first embodiment.

FIG. 1 is a block diagram illustrating a schematic configuration of a semiconductor storage device 1 according to a first embodiment, The semiconductor storage device 1 in FIG. 1 includes a memory circuit 2 and a write pulse controller 3.

The memory circuit 2 includes a non-volatile memory 4 and a memory controller 5 that controls writing to/reading from this nonvolatile memory 4. As will be described later, the non-volatile memory 4 has a property that write energy is minimized when a write pulse has a predetermined width, while a write current becomes larger as a pulse width of the write pulse becomes shorter than the predetermined width. A representative example thereof is an MRAM, In the following description, the non-volatile memory 4 is exemplified as having an MRAM array including a plurality of MRAM cells.

The memory controller 5 carries out write processing to the non-volatile memory 4 within a time period of the pulse width of the write pulse shorter than one cycle of a clock signal used to control access to the non-volatile memory 4.

The memory controller 5 includes a word line buffer (WL buffer) 6, a word line decoder (WL decoder) 7, a word line driver (WL driver) 8, an input buffer 9, a write circuit 10, a multiplexer 11 a bit line driver (BL driver) 12, a bit line decoder (BL decoder) 13, a bit line buffer (BL buffer) 14, an amplifier 15, and an output buffer 16.

The WL buffer 6 passes through a row address from a processor. The WL decoder 7 decodes the row address that has been passed through by the WL buffer 6. The WL driver 8 drives a word line to which the MRAM cell to be accessed is connected.

The input buffer 9 passes through data requested to be written by the processor.

The write circuit 10 generates a control signal for writing. The multiplexer 11 selects signal paths for write data from the processor and data read out from the MRAM array.

The BL buffer 14 passes through a column address from the processor. The BL decoder 13 decodes the column address that has been passed through by the BL buffer 14. The BL driver 12 drives a bit line to which the MRAM cell to be accessed is connected.

The amplifier 15 senses data read out from the MRAM array 4. The output buffer 16 passes through the data that has been sensed by the amplifier 15 to output.

The write pulse controller 3 in FIG. 1 includes a pulse supplier (pulse selector) 21 and a voltage supplier (voltage selector) 22. The write pulse controller 3 selects, depending on an operating state of the processor, one of a first write mode for writing to the non-volatile memory 4 with low electric power consumption and a second write mode for writing to the non-volatile memory 4 with higher electric power consumption than the case of the first write mode at higher speed than the case of the first write mode. In a case where the first write mode is selected, the write pulse controller 3 sets the pulse width of the write pulse based on the write energy such that the pulse width is shorter than one cycle of the clock signal used to control access to the nonvolatile memory 4.

More specifically, when the write pulse controller 3 writes data to the non-volatile memory 4 with low electric power consumption (in the case of the first write mode), the pulse width of the write pulse is lengthened as much as possible within a range not exceeding one cycle of the clock signal. For example, assuming that a first write pulse and a second write pulse having a longer pulse width than the first write pulse are prepared as the write pulses, the write pulse controller 3 selects the second write pulse as the write pulse to write to the non-volatile memory 4 with low electric power consumption as long as the pulse width of the second write pulse is shorter than one cycle of the clock signal, On the other hand, in a case where the pulse width of the second write pulse is equal to or longer than one cycle of the clock signal, the write pulse controller 3 selects the first write pulse as the write pulse.

Figure 2:
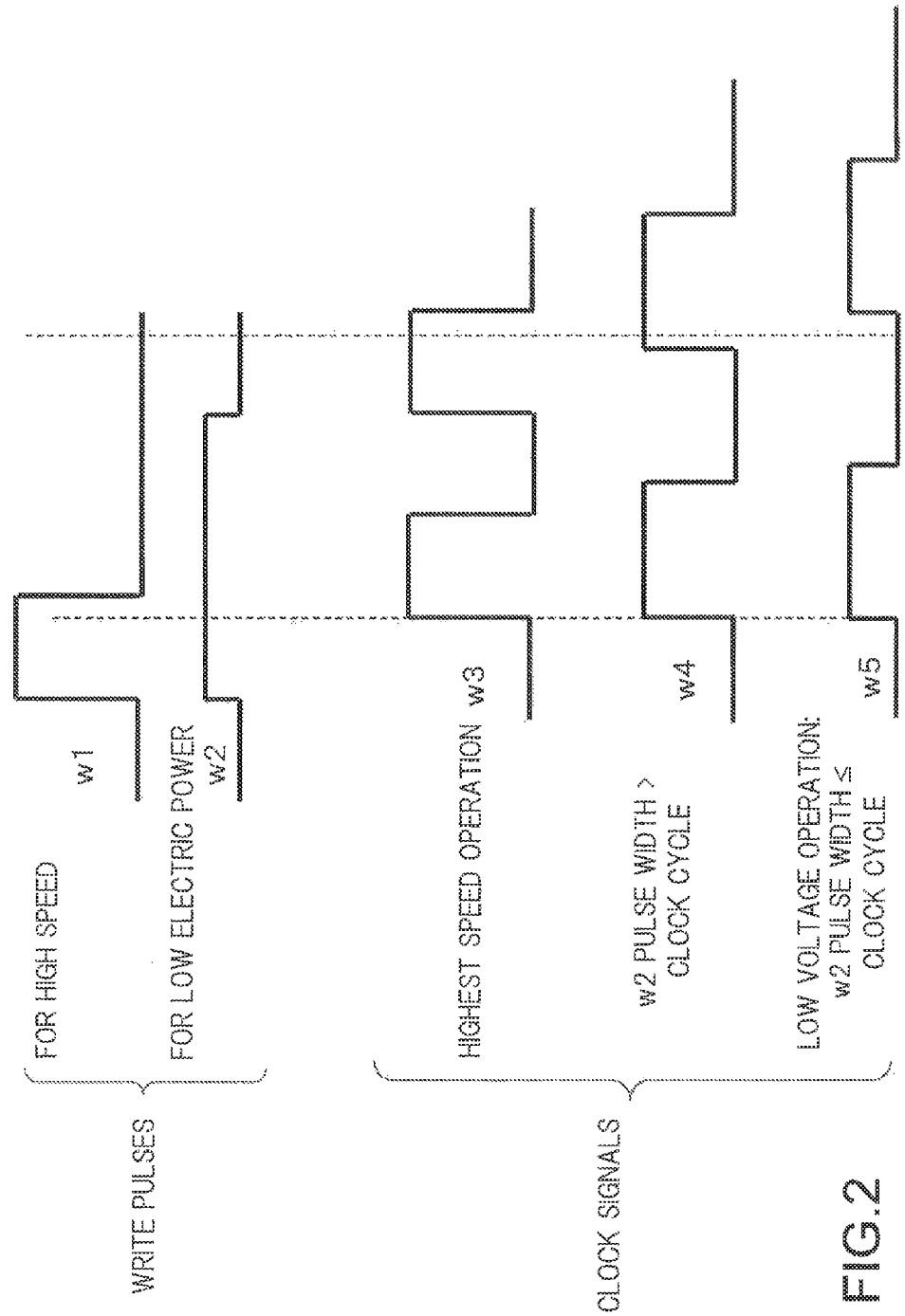
FIG. 2 is a waveform diagram for explaining pulse widths of write pulses.

FIG. 2 is a waveform diagram for explaining the pulse widths of the write pulses, The write pulse controller 3 variably controls the pulse width of the write pulse depending on the operating state of the processor. In order to complete the write processing to the non-volatile memory 4 within a period of the pulse width of the write pulse, a pulse width of a write pulse w1 used during high-speed writing is set so as to be shorter than a pulse width of a write pulse w2 used during writing with low electric power consumption.

As illustrated in FIG. 2, a frequency of the clock signal used to control access to the non-volatile memory 4 varies depending on the operating state of the processor. FIG. 2 depicts clock signal waveforms w3, w4, and w5 having three different frequencies from each other. The frequencies of the dock signal waveforms w3, w4, and w5 become slower in this order. Dashed lines in FIG. 2 indicate the pulse width of the write pulse w2.

When the write processing to the non-volatile memory 4 is not completed within one cycle of the dock signal, it is difficult to perform writing in a cycle of each clock. Accordingly, it is desirable for the write pulse controller 3 to set the write pulse such that the pulse width thereof is shorter than one cycle of the clock signal.

The MRAM used as the non-volatile memory 4 has such a characteristic that a write voltage and the write energy vary depending on the pulse width of the write pulse. Graph G1 in FIG. 3 illustrates a correspondence relationship between a write time and the write voltage of the MRAM, whereas graph G2 in FIG. 3 illustrates a correspondence relationship between the write time and the write energy of the MRAM.

The write time is equivalent to the pulse width of the write pulse, where the write time becomes shorter as the pulse width becomes shorter. Note that a vertical axis of graph G1 in FIG. 3 represents the write voltage, However, a similar property is obtained as well when the write current is used as the vertical axis.

Figure 3:
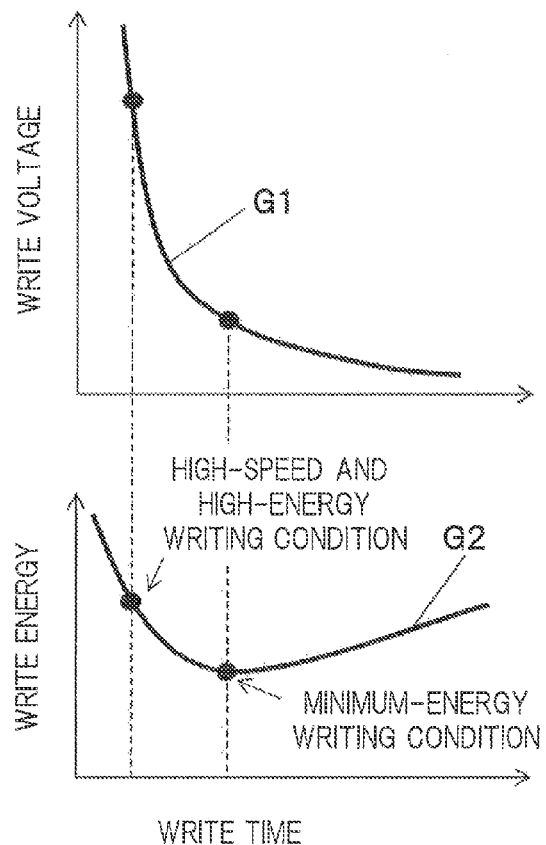
FIG. 3 is a diagram where graph G1 illustrates a correspondence relationship between a write time and a write voltage of an MRAM, whereas graph G2 illustrates a correspondence relationship between the write time and write energy of an MRAM.

As illustrated in graph G1 in FIG. 3, the write voltage increases in the MRAM as the pulse width of the write pulse becomes narrower. In addition, as illustrated in graph G2 in FIG. 3, the write energy varies in the MRAM depending on the write time, where the write energy increases as moving away from a predetermined point in the write time at which the write energy is minimum, In particular, write energy becomes higher as the write time becomes shorter, in other words, as the pulse width of the write pulse becomes narrower.

Taking graph G1 and graph G2 in FIG. 3 into consideration, it is clear that, in order to reduce the electric power consumption while writing to the non-volatile memory 4 having the MRAM, setting a longer pulse width of the write pulse is desirable rather than setting a shorter pulse width.

As indicated by the clock signals w3 to w5 in FIG. 2, the frequency of the dock signal varies depending on the operating state of the processor. Accordingly, it is not easy to set the pulse width of the write pulse such that the write energy is minimized. For this reason, when writing to the non-volatile memory 4 with low electric power consumption (in the case of the first write mode), the write pulse controller 3 compares, with one cycle of the clock signal, the pulse width of each of the first write pulse and the second write pulse prepared in advance as candidates for the write pulse. When the pulse width of the second write pulse having a longer pulse width is equal to or shorter than one cycle of the clock signal, the second write pulse is selected as the write pulse, On the other hand, when one cycle of the clock signal is shorter than the pulse width of the second write pulse, the first write pulse is selected as the write pulse.

For example, in the case of the clock signal w3 in FIG. 2, the pulse width of the second write pulse w2 is longer than one cycle of the clock signal w3 and thus the first write pulse w1 is selected as the write pulse, The same applies to the case of the clock signal w4, Compared to this, in the case of the clock signal w5, one cycle of the clock signal w5 is longer than the pulse width of the second write pulse w2 and thus the second write pulse w2 is selected as the write pulse.

Next, internal configurations of the pulse supplier 21 and the voltage supplier 22 in FIG. 1 in the write pulse controller 3 will be described. State signals indicating the operating state of the processor are supplied to the pulse supplier 21 and the voltage supplier 22 from the processor. The pulse supplier 21 and the voltage supplier 22 use these state signals as operation switching signals to switch the operating states thereof.

The pulse supplier 21 includes a plurality of pulse generators 23 that generates a plurality of pulse signals having different pulse widths from each other and a pulse selector 24 that selects one pulse signal from among this plurality of pulse signals. The pulse selector 24 selects one pulse signal from among the plurality of pulse signals based on the state signal from the processor.

The voltage supplier 22 includes a voltage selector that selects one voltage from among a plurality of voltages supplied from the outside thereof or generated in the inside thereof. The voltage selector selects one voltage from among the plurality of voltages based on the state signal from the processor.

Figure 4:
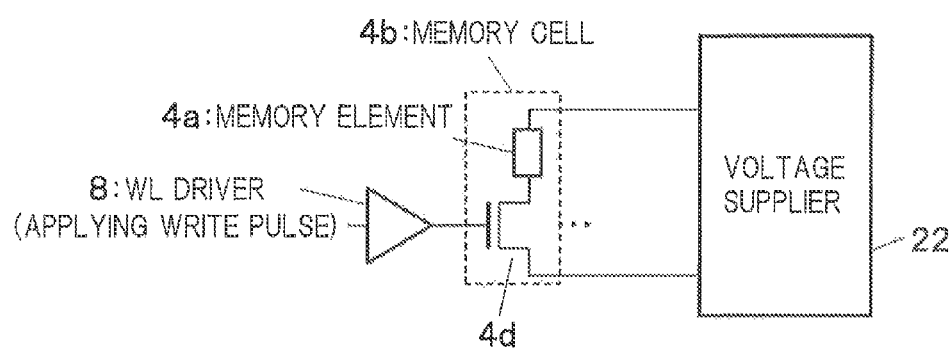
FIG. 4 is a block diagram illustrating the vicinity of one memory element 4a within a non-volatile memory 4.

FIG. 4 is a block diagram illustrating the vicinity of one memory element 4a within the non-volatile memory 4. As illustrated in FIG. 4, the voltage supplier 22 is connected to one end of the memory element 4a, whereas a source of a transistor 4d is connected to the other end of the memory element 4a. The voltage supplier 22 is connected to a source of the transistor 4d, In addition, the WL driver 8 is connected to a gate of the transistor 4d, The WL driver 8 switches the gate of the transistor 4d to a high level upon being supplied with a pulse from the pulse supplier 21 to turn on the transistor 4d.

When the transistor 4d in FIG. 4 is turned on, a voltage supplied from the voltage supplier 22 is applied to the one end of the memory element 4a. With this, the write pulse is caused to appear on both ends of the memory element 4a during a period for which the transistor 4d is being turned on. This write pulse performs data writing to the memory element 4a.

FIG. 4 illustrates an example of one memory cell 4b using one memory element 4a and one transistor 4d. However, one memory cell 4b may have the plurality of memory elements 4a and the plurality of transistors 4d.

As described above, according to the first embodiment, when writing to the non-volatile memory 4 is determined to be performed with low electric power consumption (in the case of the first write mode), the pulse width of the write pulse is set based on the write energy within a range not exceeding one cycle of the clock signal. Therefore, even when the nonvolatile memory 4 is used whose write voltage increases as the pulse width of the write pulse becomes shorter as in the MRAM, it is possible to decrease the electric power consumption. In particular, the pulse width of the write pulse is selected depending on the operating state of the processor and thus the electric power consumption of the non-volatile memory 4 can be reduced without deteriorating the processing performance of the processor.

Second Embodiment

In a second embodiment, not only the operating state of the processor but also the operating state of the nonvolatile memory 4 is taken into consideration to determine the pulse width of the write pulse.

Figure 5:
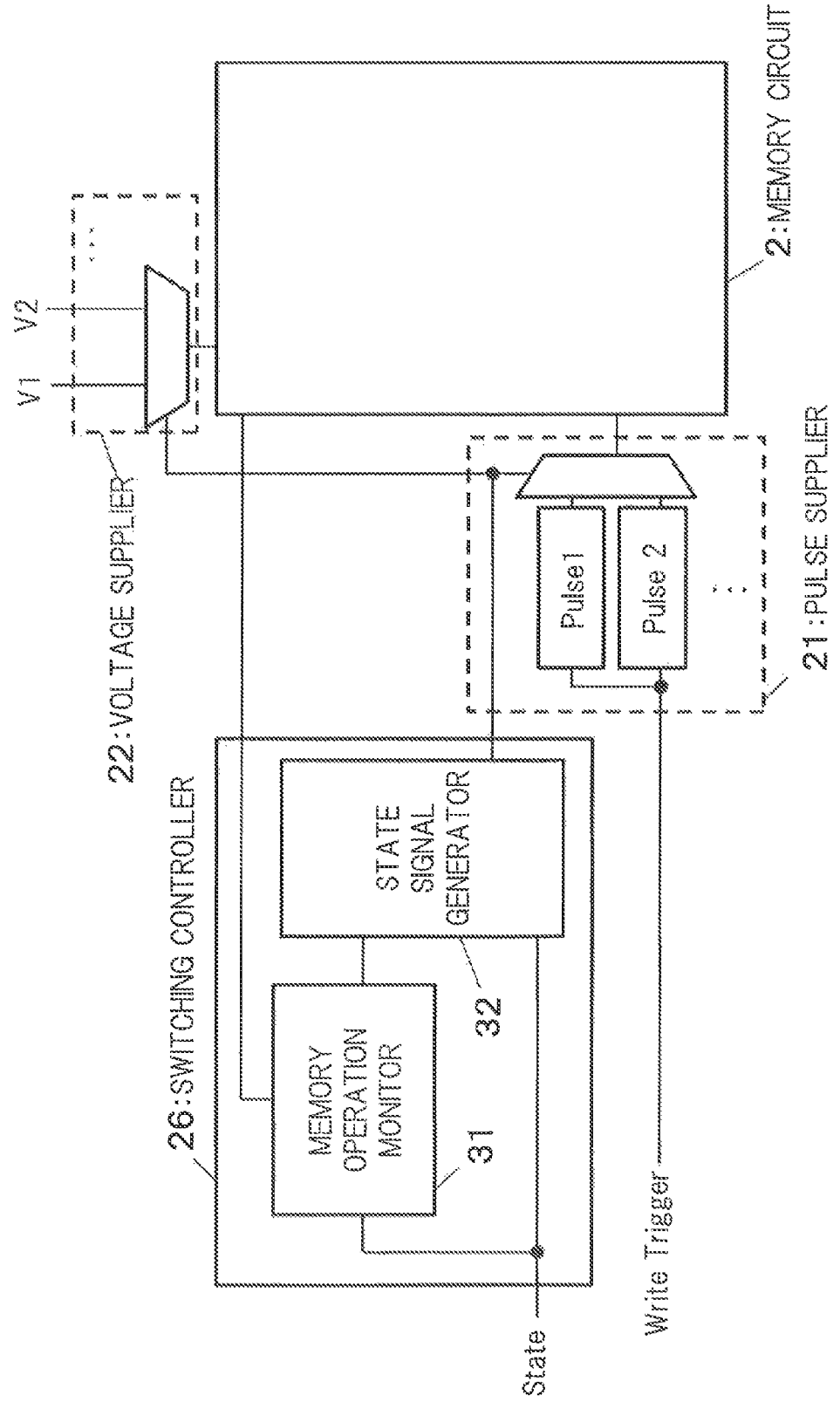
FIG. 5 is a block diagram illustrating a schematic configuration of a semiconductor storage device 1 according to a second embodiment.

FIG. 5 is a block diagram illustrating a schematic configuration of a semiconductor storage device 1 according to the second embodiment. The semiconductor storage device 1 in FIG. 5 also includes a memory circuit 2 and a write pulse controller 3 as in FIG. 1. However, the internal configuration of the write pulse controller 3 is different from that in FIG. 1.

The write pulse controller 3 in FIG. 5 includes a switching controller 26 in addition to a pulse supplier 21 and a voltage supplier 22, Based on the operating state of the non-volatile memory 4 as well as the state signal indicating the operating state of the processor, the switching controller 26 generates operation switching signals used to switch the operation of the pulse supplier 21 and the voltage supplier 22.

More specifically, the switching controller 26 in FIG. 5 includes a memory operation monitor 31 and a state signal generator 32. The memory operation monitor 31 observes the operating state of the nonvolatile memory 4 such as an access distribution or an access frequency to generate a signal indicating the observation results. Based on the signal indicating the observation results by the memory operation monitor 31 and the state signal indicating the operating state of the processor, the state signal generator 32 generates operation switching signals. Depending on the generated operation switching signals, the pulse supplier 21 switches the pulse signals and the voltage supplier 22 switches the voltages.

Figure 6:
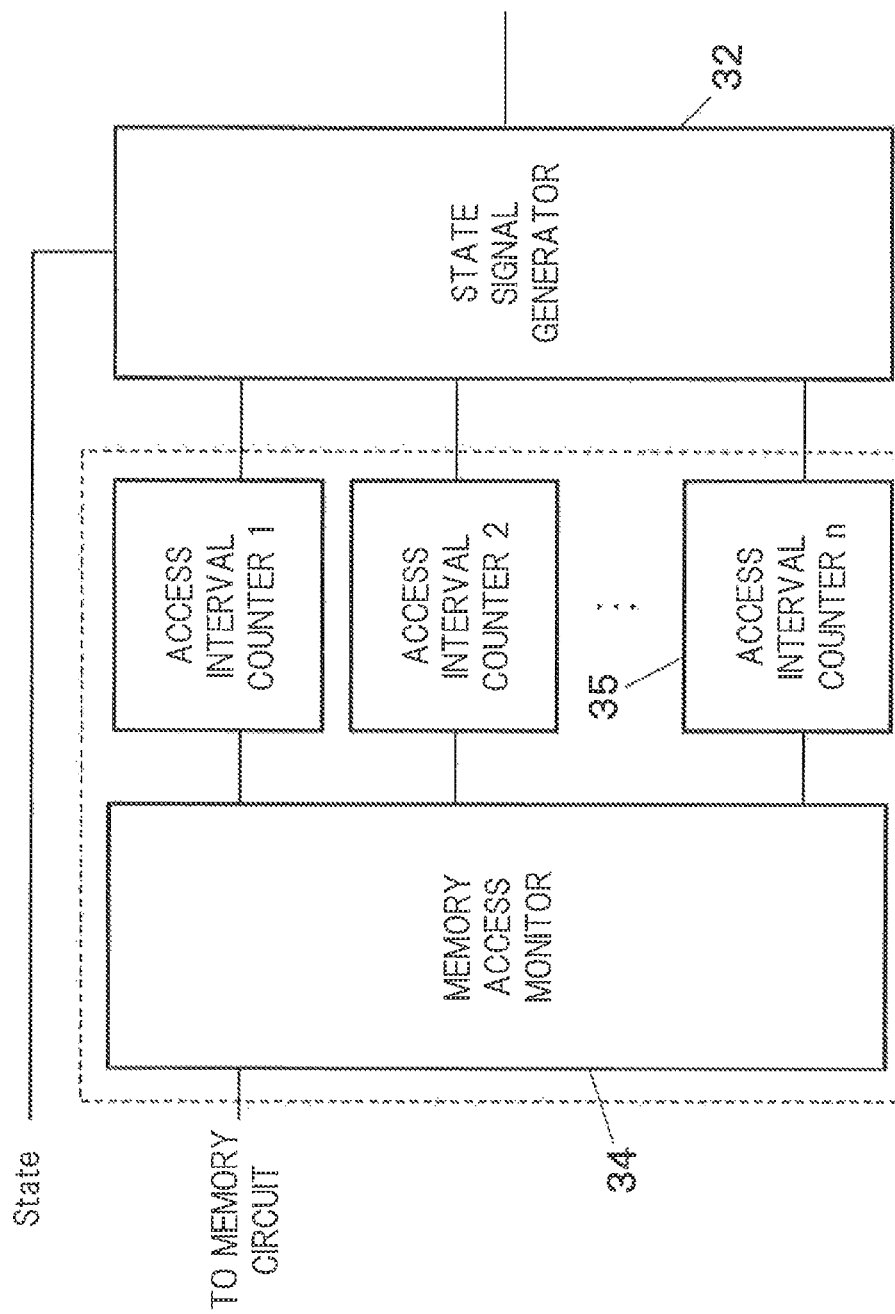
FIG. 6 is a block diagram illustrating a specific example of a memory operation monitor 31.

FIG. 6 is a block diagram illustrating a specific example of the memory operation monitor 31. The memory operation monitor 31 in FIG. 6 includes a memory access monitor 34 that acquires an interval of memory access and n access interval counters (access history storage units) 35 that store intervals of memory access of the last n time(s) (where n is an integer equal to or larger than one), For example, kth access interval counter 35 stores an access interval to the non-volatile memory 4 k time(s) earlier (where k is a natural number equal to or smaller than n). Larger access intervals stored in the n access interval counters 35 indicate a lower access frequency to the non-volatile memory 4. Accordingly, the state signal generator 32 generates an operation switching signal indicating the lower access frequency. With this, the pulse width of the write pulse generated by the pulse supplier 21 and the voltage supplier 22 is widened. Consequently, the second write pulse is generated, When all of the n access interval counters 35 have completed storing, stored information is sequentially updated starting from an access interval counter 35 storing the oldest information.

The state signal generator (pulse determination unit or pulse determinator) 32 may generate the operation switching signal based on an average value of n access intervals stored in the n access interval counters 35. Alternatively, the operation switching signal may be generated by giving more priority to access intervals stored in access interval counters 35 closer to the current time point.

As described thus far, according to the second embodiment, not only the operating state of the processor but also the operating state of the non-volatile memory 4 is taken into consideration to determine the pulse width of the write pulse. Therefore, in a case where, for example, the processor is operating at high speed while the access intervals to the non-volatile memory 4 are small, the pulse width of the write pulse to the non-volatile memory 4 is widened, thereby reducing the electric power consumption of the memory circuit 2 without deteriorating the processing performance of the processor.

Third Embodiment

In a third embodiment, when a non-volatile memory 4 includes a plurality of memory blocks, the operating states of the respective memory blocks are observed to set the pulse width of the write pulse.

Figure 7:
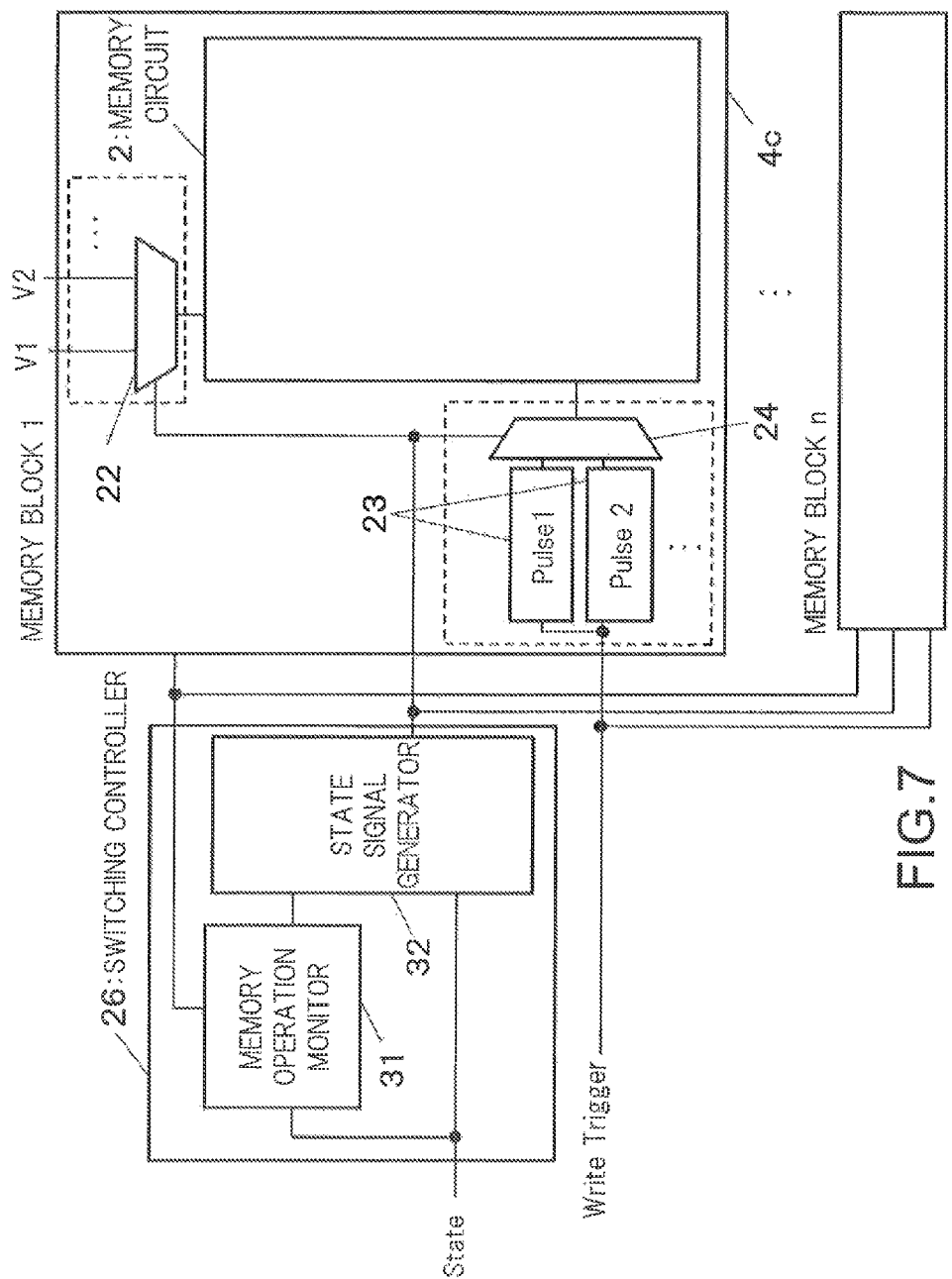
FIG. 7 is a block diagram illustrating a schematic configuration of a semiconductor storage device 1 according to a third embodiment.

FIG. 7 is a block diagram illustrating a schematic configuration of a semiconductor storage device 1 according to the third embodiment. The semiconductor storage device 1 in FIG. 7 includes the plurality of memory blocks 4c. A memory circuit 2, a pulse supplier 21, and a voltage supplier 22 are provided in the inside of each of the memory blocks 4c.

A switching controller 26 in FIG. 7 also includes a memory operation monitor 31 and a state signal generator 32 as in the switching controller 26 in FIG. 5. The memory operation monitor 31 observes the operating states of all of the memory blocks 4c to generate signals indicating results of the observation. Based on the signals indicating results of the observation by the memory operation monitor 31 and the state signal from the processor, the state signal generator 32 generates operation switching signals, This operation switching signal is transmitted to each of the memory blocks 4c such that the pulse supplier 21 and the voltage supplier 22 within each of the memory blocks 4c generate the write pulse depending on the operation switching signal.

Figure 8:
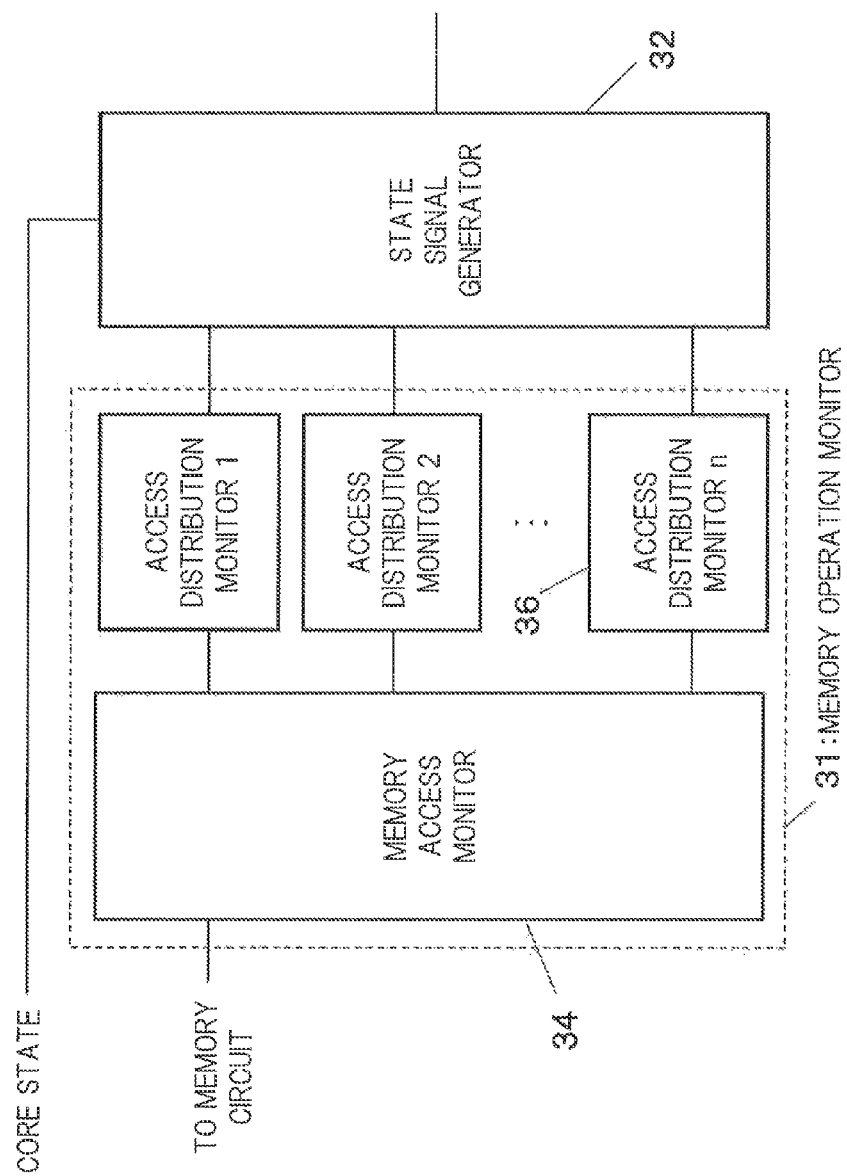
FIG. 8 is a block diagram illustrating a first example of an internal configuration of a memory operation monitor 31 according to the third embodiment.

FIG. 8 is a block diagram illustrating a first example of an internal configuration of the memory operation monitor 31 according to the third embodiment. The memory operation monitor 31 in FIG. 8 includes a memory access monitor 34 that acquires information on memory blocks 4c that have been accessed n time(s) (where n is an integer equal to or larger than one) in the past and n access distribution monitors 36 that store the acquired information.

When all of the n access distribution monitors 36 have completed storing, stored information is sequentially updated starting from an access distribution monitor 36 storing the oldest information.

The memory operation monitor 31 may monitor intervals of memory access in the past as well as the information on the memory blocks 4c that have been accessed n time(s) in the past (access distribution information).

Figure 9:
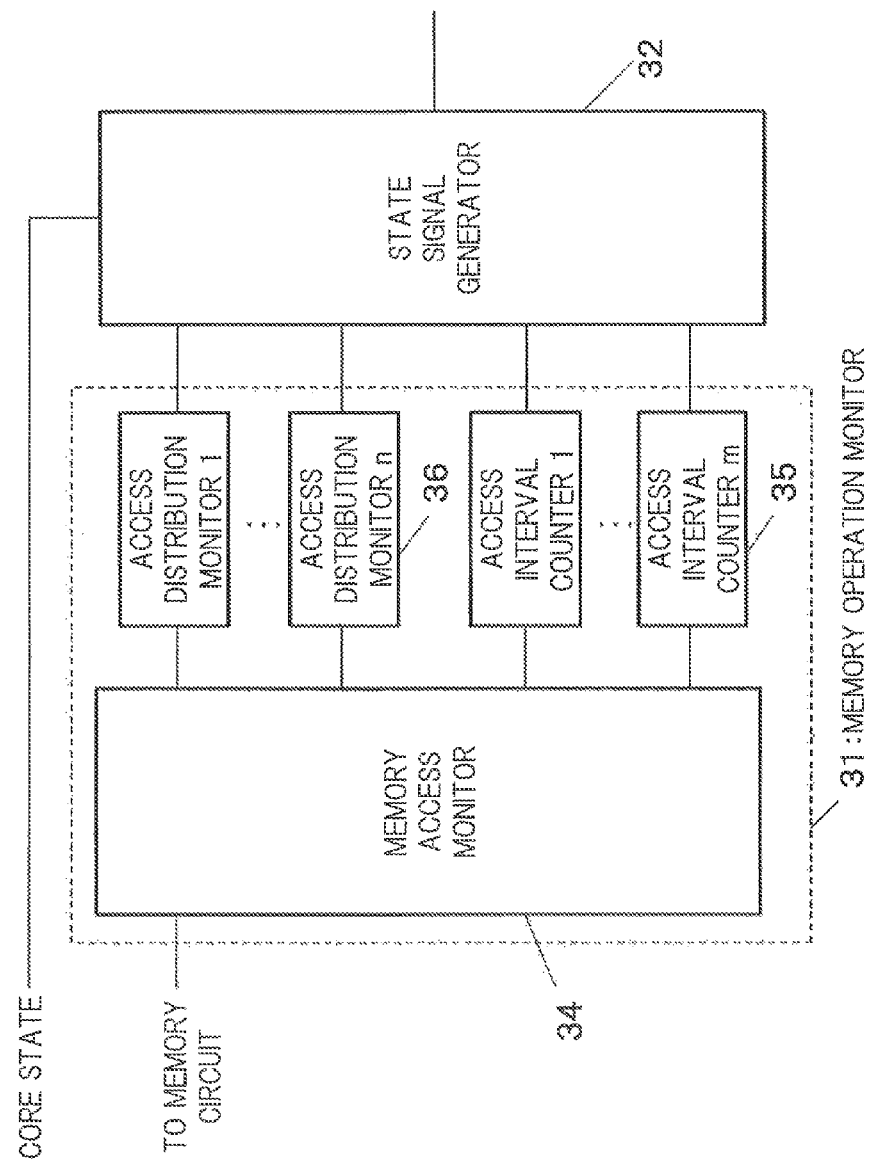
FIG. 9 is a block diagram illustrating a second example of the internal configuration of the memory operation monitor 31 according to the third embodiment.

FIG. 9 is a block diagram illustrating a second example of the internal configuration of the memory operation monitor 31 according to the third embodiment. The memory operation monitor 31 in FIG. 9 includes m access interval counters 35 in addition to the configuration in FIG. 8. These access interval counters 35 are similar to the access interval counters 35 in FIG. 6. Alternatively, the access interval counters 35 may be prepared for the number of the memory blocks 4c such that each of the access interval counters 35 measures an access interval of a corresponding memory block 4c.

As described thus far, according to the third embodiment, the access distribution information indicating which memory block 4c has been accessed among the plurality of memory blocks 4c is stored to select a pulse based on the stored access distribution information. Therefore, even when the non-volatile memory 4 is divided into the plurality of memory blocks 4c, the electric power consumption of the memory circuit 2 can be reduced.

Additionally, not only the access distribution information but also the access intervals are monitored to determine the pulse width of the write pulse. Accordingly, performance in writing to each of the memory blocks 4c can be precisely controlled, whereby the electric power consumption of the memory circuit 2 can be reduced without deteriorating the processing performance of the processor.

Fourth Embodiment

In a fourth embodiment, the write pulse of a cache memory is controlled.

Figure 10:
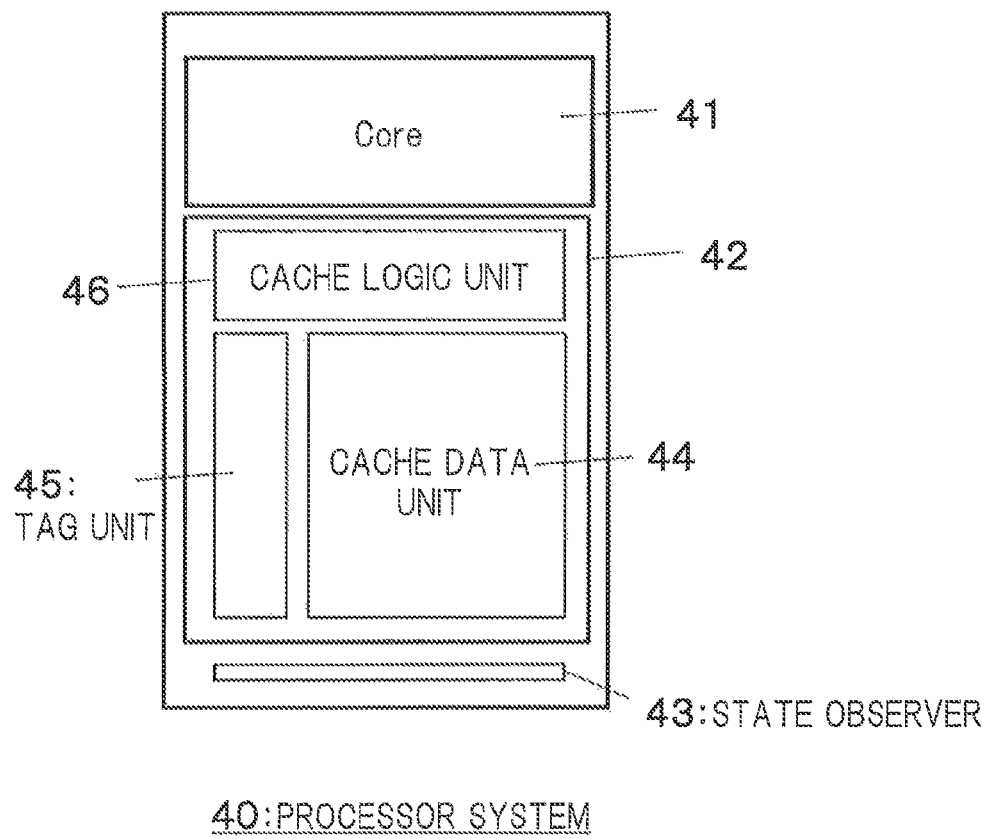
FIG. 10 is a schematic block diagram of a processor system 40.

FIG. 10 is a schematic block diagram of a processor system 40. The processor system 40 in FIG. 10 includes a core unit 41, a cache memory 42, and a state observer 43.

The core unit 41 includes an arithmetic core and an L1 cache. The processor has the core unit 41 and the state observer 43.

The cache memory 42 is, for example, an L2 cache and includes a cache data unit (cache data storage) 44, a tag unit (tag storage) 45, and a cache logic unit 46, The cache memory 42 may have the plurality of layered cache memories 42 in some cases, However, FIG. 10 depicts one layer of the cache memory 42 for simpler description.

The state observer 43 observes processing load of the arithmetic core and input from/output to the outside to adjust a voltage level of power source of the processor or control the transition of the operating state of the arithmetic core.

Figure 11:
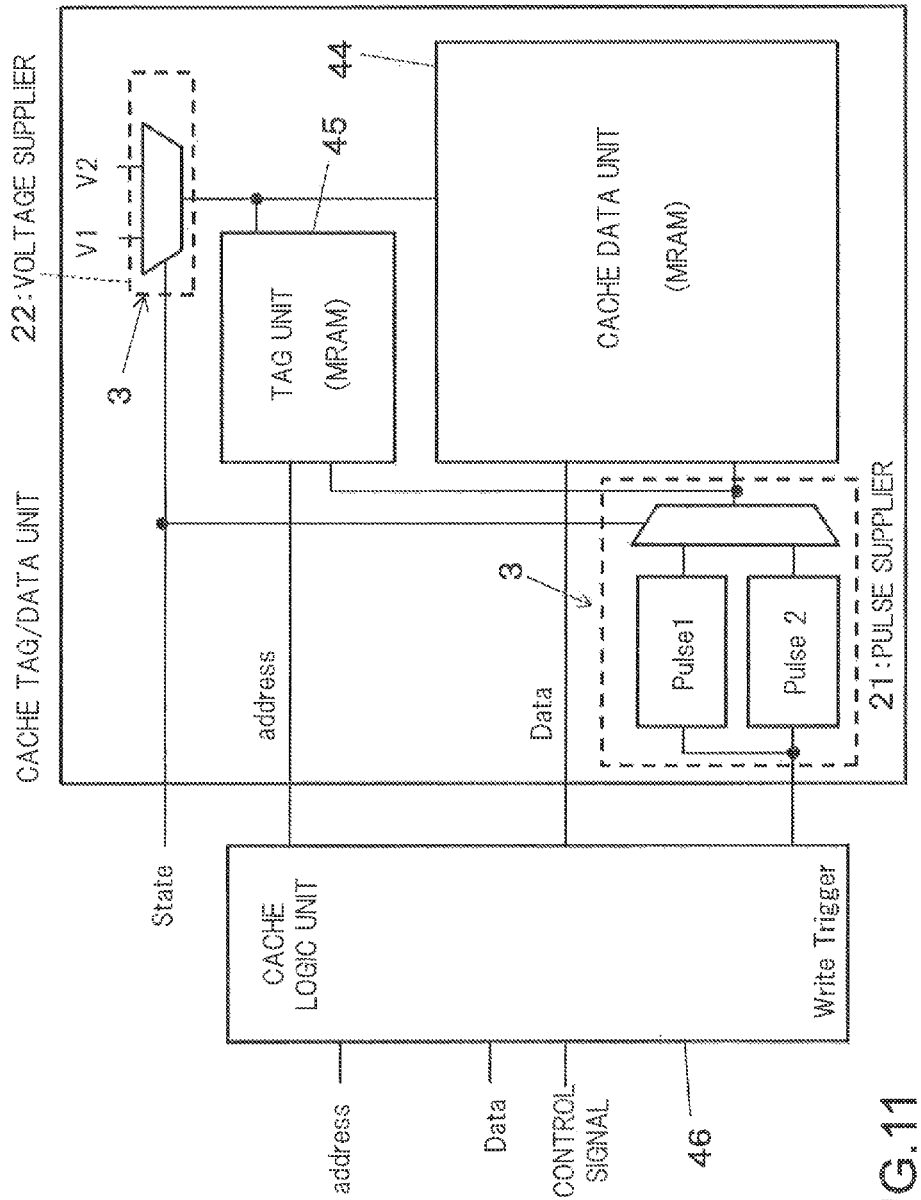
FIG. 11 is a block diagram illustrating a first example of an internal configuration of a cache memory 42 in FIG. 10.

FIG. 11 is a block diagram illustrating a first example of an internal configuration of the cache memory 42 in FIG. 10. The cache memory 42 in FIG. 11 includes, in addition to the cache data unit 44, the tag unit 45, and the cache logic unit 46, a write pulse controller 3 similar to that in the first to third embodiments. The write pulse controller 3 includes a pulse supplier 21 and a voltage supplier 22. The pulse signals selected by the pulse supplier 21 and the voltages selected by the voltage supplier 22 are supplied to both of the cache data unit 44 and the tag unit 45.

The state signal is input to the cache memory 42 from the processor. The pulse supplier 21 and the voltage supplier 22 within the write pulse controller 3 carry out selection operation based on this state signal. For example, a plurality of pulse generators 23 within the pulse supplier 21 synchronizes with a write trigger signal output from the cache logic unit 46 to generate the pulse signal. A pulse selector 24 selects one of the pulse signals based on the state signal.

FIG. 11 illustrates an example in which both of the cache data unit 44 and the tag unit 45 have the MRAMs. In this case, the cache data unit 44 and the tag unit 45 carry out write operation using the write pulses having a common pulse width.

In some cases, the tag unit 45 has an SRAM having higher speed than the MRAM. In this case, it is desirable that the write pulse be not controlled by the write pulse controller 3 for the tag unit 45. This is because the SRAM does not have the property as indicated in graph G1 and graph G2 in FIG. 3 described above.

Figure 12:
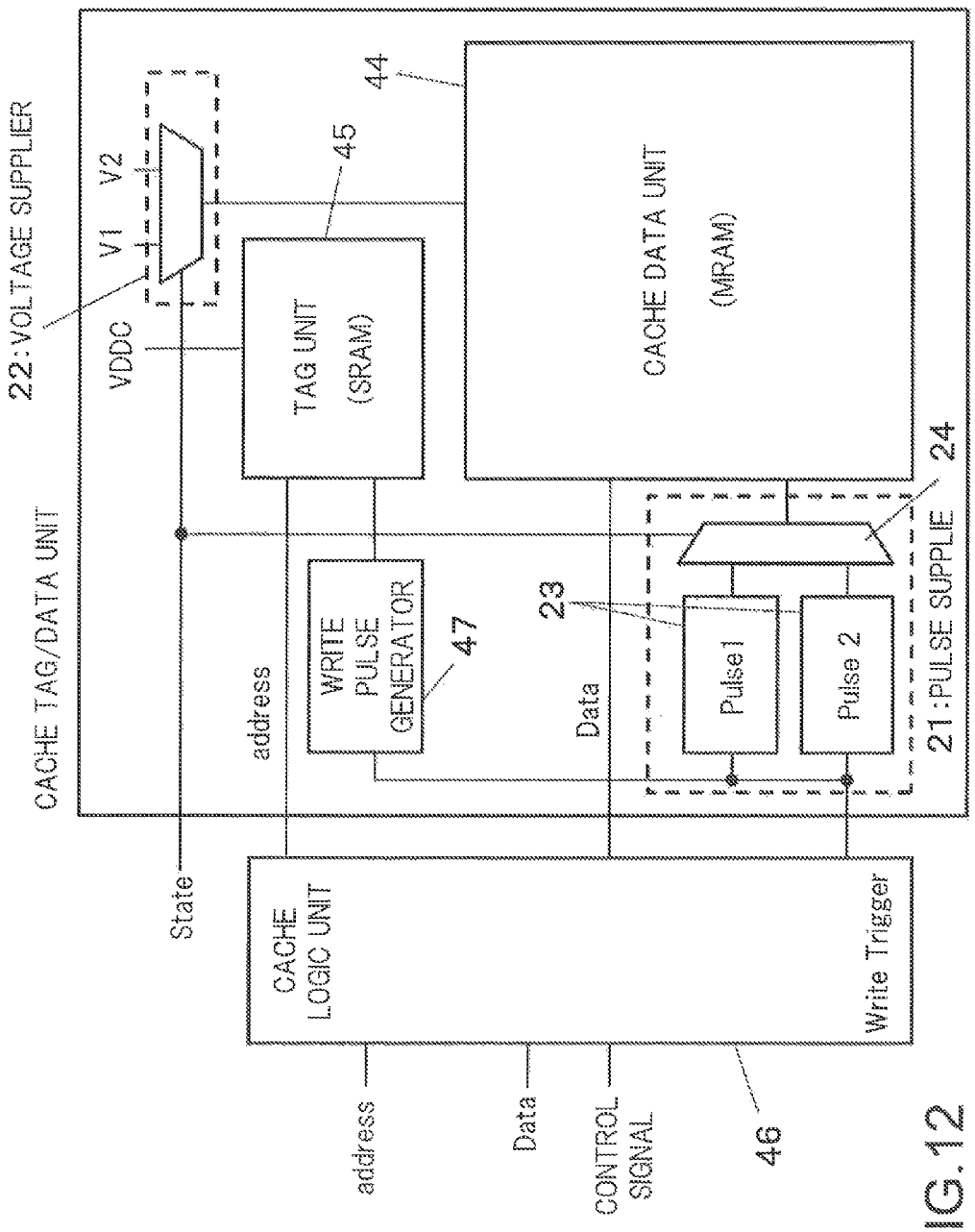
FIG. 12 is a block diagram illustrating a second example of the internal configuration of the cache memory 42 in FIG. 10.

FIG. 12 is a block diagram illustrating a second example of the internal configuration of the cache memory 42 in FIG. 10. In FIG. 12, the cache data unit 44 has the MRAM, whereas the tag unit 45 has the SRAM. The cache memory 42 in FIG. 12 includes a write pulse generator 47 that generates the write pulse for the tag unit 45.

The write trigger signals output from the cache logic unit 46 are supplied to the pulse supplier 21 and the write pulse generator 47. The write pulse generator 47 generates the write pulse for the tag unit 45 to supply to the tag unit 45. In a case where the aforementioned DVFS technique is employed, the write pulse generator 47 variably controls the pulse width of the write pulse depending on a voltage level of a power source voltage VDDC.

As described above, in the cache memory 42 in FIG. 12, the write pulse controller 3 controls the pulse width of the write pulse exclusively for the cache data unit 44 having the MRAM.

Figure 13:
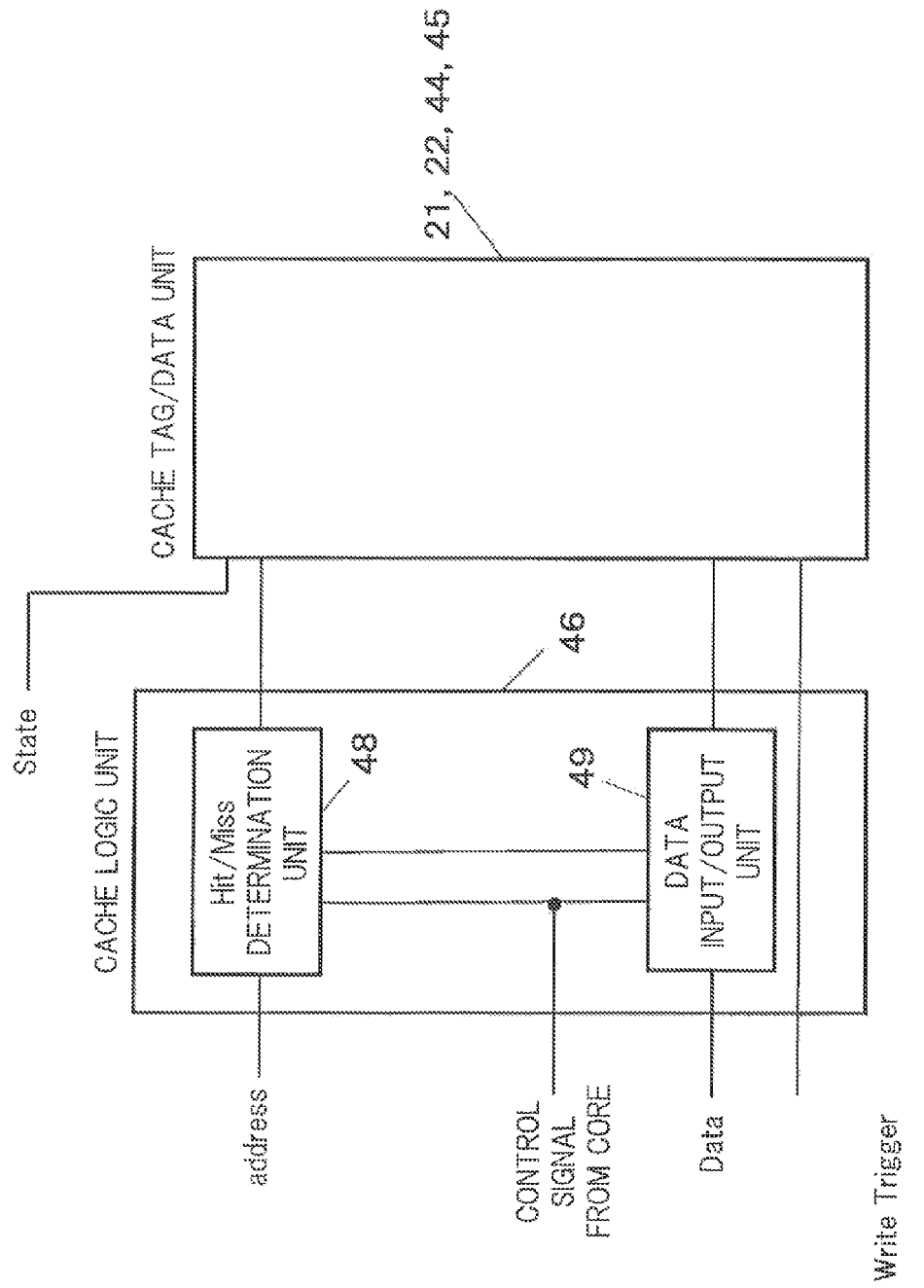
FIG. 13 is a block diagram illustrating a first example of an internal configuration of a cache logic unit 46 in FIGS. 11 and 12.

FIG. 13 is a block diagram illustrating a first example of an internal configuration of the cache logic unit 46 in FIGS. 11 and 12. The cache logic unit 46 in FIG. 13 includes a hit/miss determination unit (hit/miss determinator) 48 and a data input/output unit 49. The hit/miss determination unit 48 determines, based on the control signal from the processor, whether an address of data requested to be accessed matches an address stored in the tag unit 45. The data input/output unit 49 controls, based on the control signal from the processor, input/output of data written to/read from the cache data unit 44.

Even when the processor is operating at the highest speed, the access frequency to the cache memory 42 is low in some cases. In such a case, high-speed writing to the cache memory 42 hardly affects the processing performance of the processor and consequently, the electric power consumption is unnecessarily wasted, For a solution to this, a state of the processor and a state of the cache memory 42 may be taken into consideration to control the pulse width of the write pulse to the cache memory 42.

Figure 14:
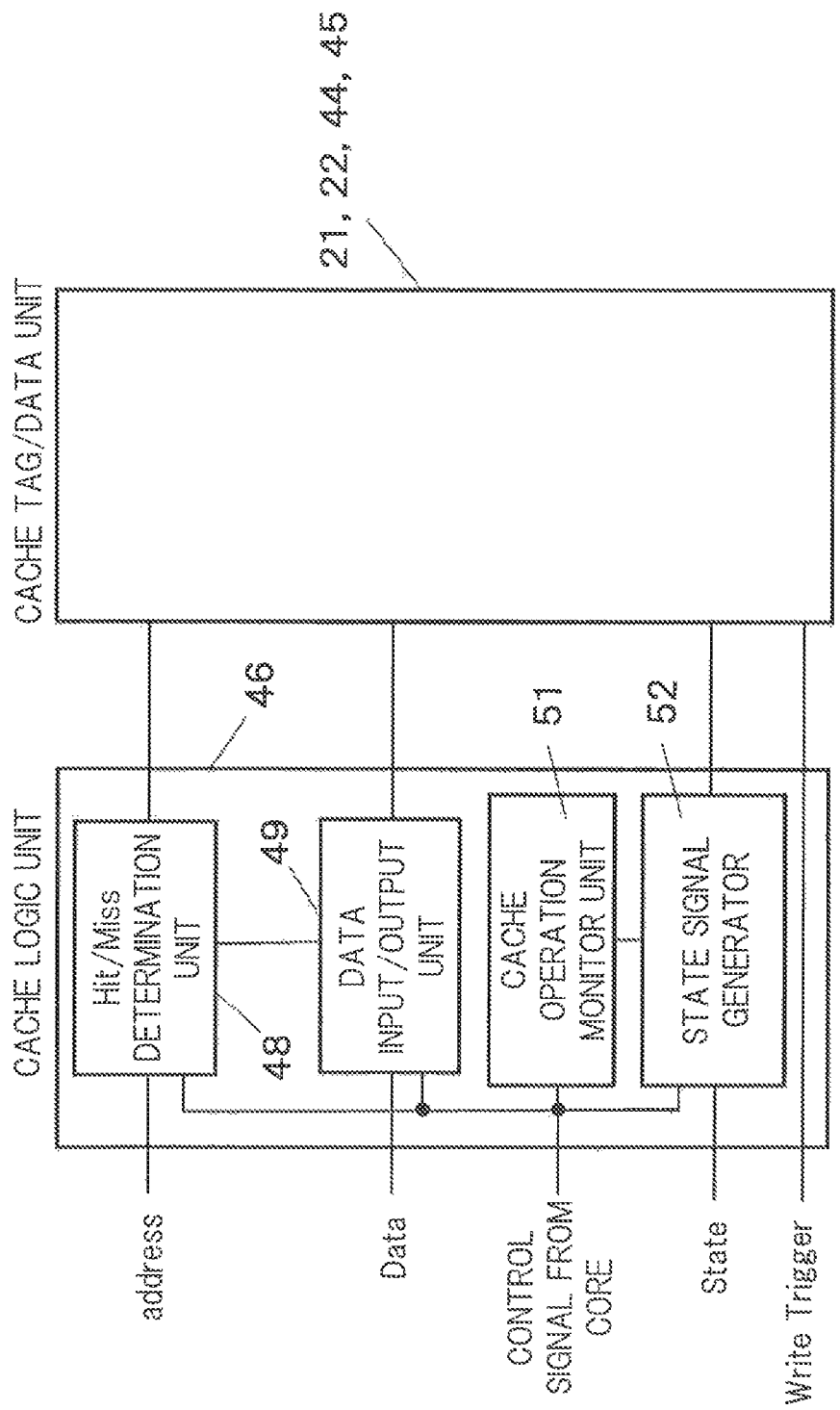
FIG. 14 is a block diagram illustrating a second example of the internal configuration of the cache logic unit 46.

FIG. 14 is a block diagram illustrating a second example of the internal configuration of the cache logic unit 46. The cache logic unit 46 in FIG. 14 includes a cache operation monitor unit 51 and a state signal generator 52 in addition to the configuration in FIG. 13.

The cache operation monitor unit 51 monitors the operating state of the cache data unit 44 to generate a state signal indicating the operating state of the cache data unit 44. The cache operation monitor unit 51 monitors the operating state of the cache data unit 44 such as the access distribution or the access interval of the cache data unit 44. A storage unit may be provided depending on the necessity to store history information on the access distribution and the access interval of the cache data unit 44.

Based on the state signal of the processor and the state signal of the cache memory 42 from the cache operation monitor unit 51, the state signal generator 52 generates a state signal for controlling the pulse width of the write pulse of the cache data unit 44 or state signals for controlling the pulse widths of the write pulses of the cache data unit 44 and the tag unit 45. The state signals generated by the state signal generator 52 are supplied to the pulse supplier 21 and the voltage supplier 22 in FIGS. 12 and 13.

Figure 15:
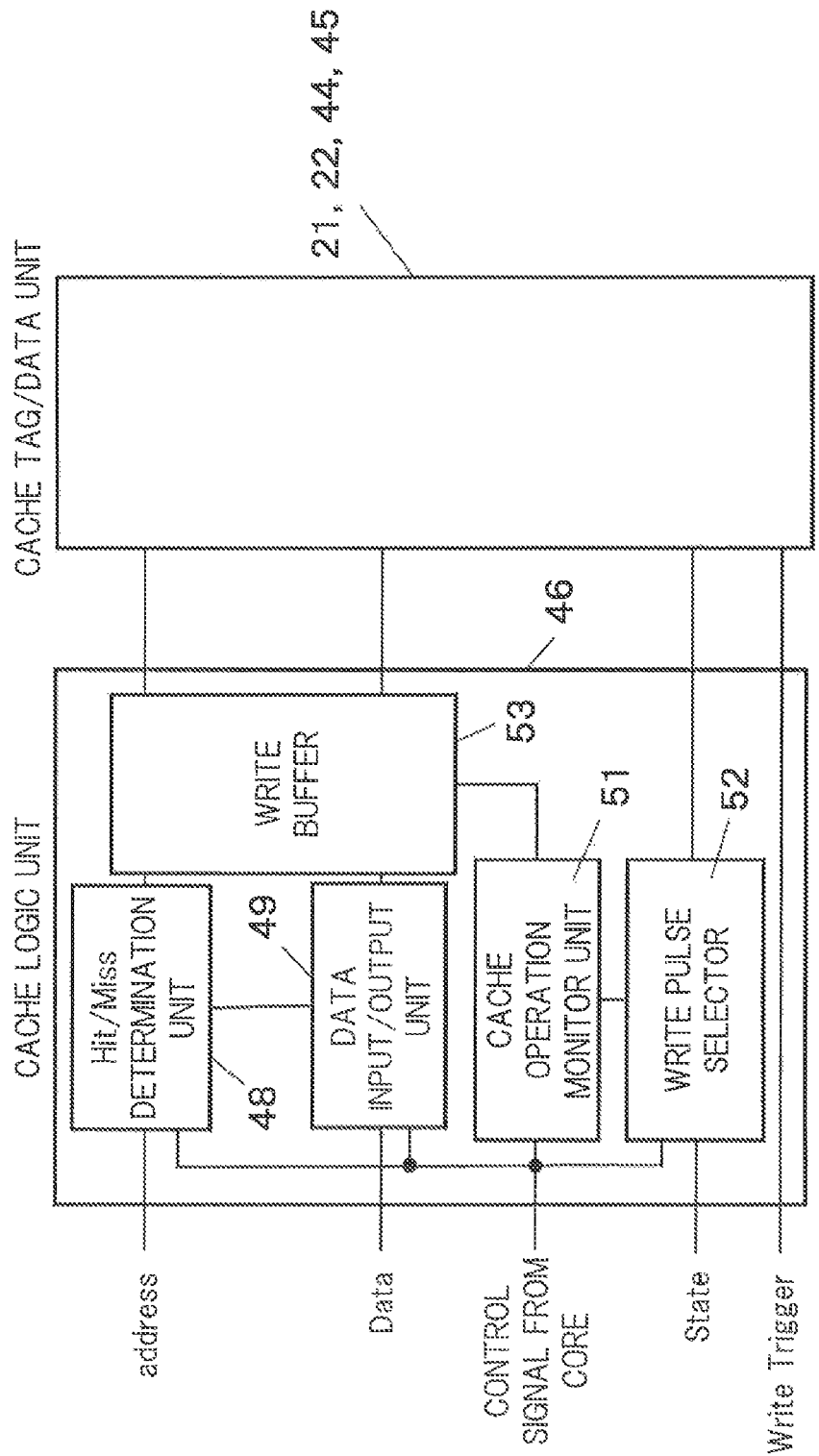
FIG. 15 is a block diagram illustrating a third example of the internal configuration of the cache logic unit 46.

FIG. 15 is a block diagram illustrating a third example of the internal configuration of the cache logic unit 46. The cache logic unit 46 in FIG. 15 includes a write buffer 53 in addition to the configuration in FIG. 14. The write buffer 53 temporarily retains, in advance, data to be written to the cache data unit 44 and the tag unit 45. The write buffer 53 may set a plurality of entries in the order of writing to retain write data per entry.

Instead of monitoring the cache data unit 44, the cache operation monitor unit 51 in FIG. 15 monitors an occupied state of the plurality of entries included in the write buffer 53. When the write buffer 53 has many empty entries, it is considered that high-speed writing to the cache data unit 44 is not necessary. In this case, the cache operation monitor unit 51 supplies, to the state signal generator 52, the state signal representing that high-speed writing to the cache data unit 44 is not necessary.

As described above, the pulse width of the write pulse to the cache data unit 44 is widened when the write buffer 53 has many empty entries, whereas the pulse width of the write pulse is narrowed when the write buffer 53 has few empty entries.

Figure 16:
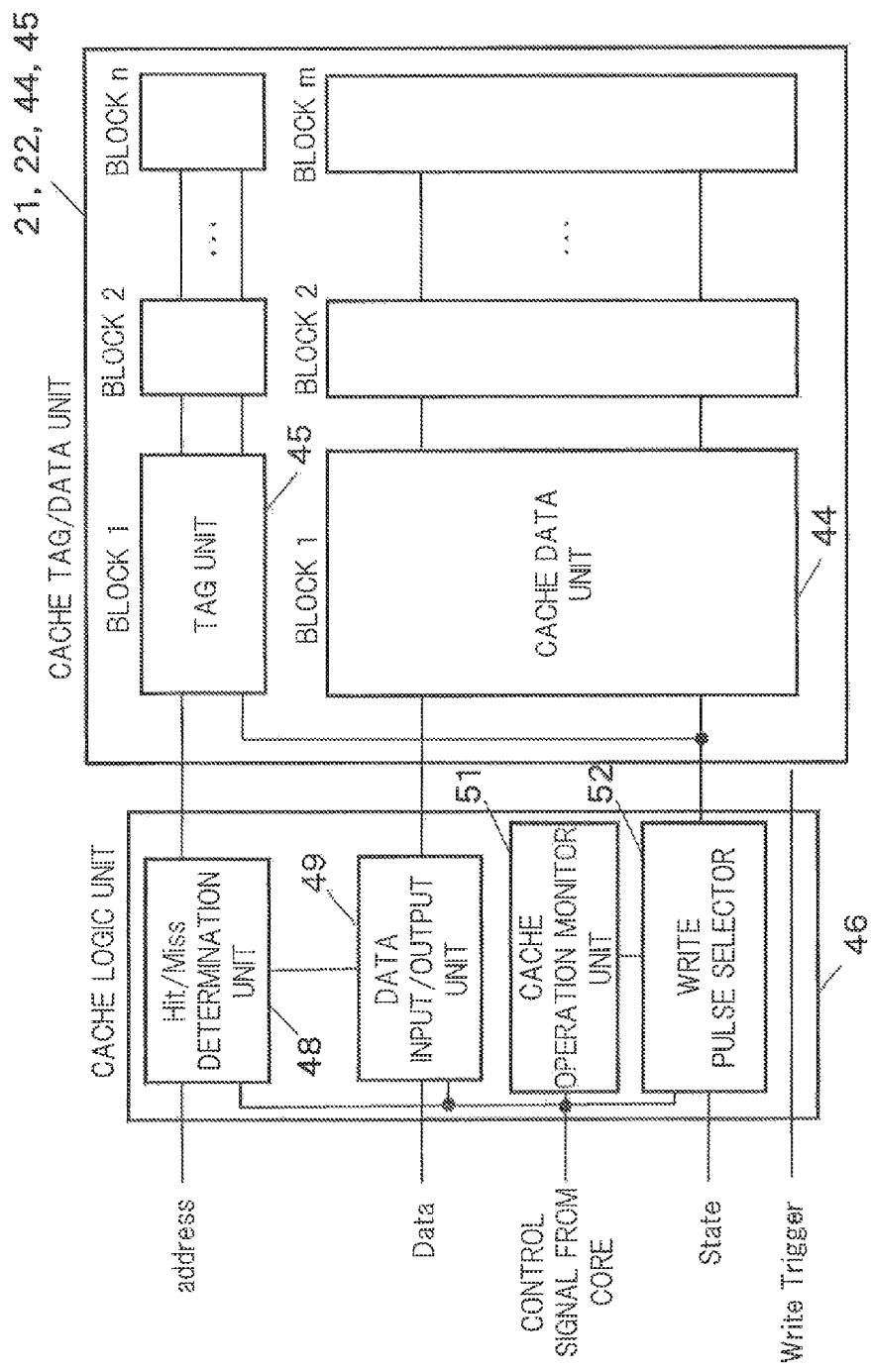
FIG. 16 is a block diagram illustrating a third example of the internal configuration of the cache memory 42 in FIG. 10.

The cache memory 42 may be divided into a plurality of blocks. For example, FIG. 16 is a block diagram illustrating a third example of the internal configuration of the cache memory 42 in FIG. 10. Each of the cache data unit 44 and the tag unit 45 within the cache memory 42 in FIG. 16 is divided into a plurality of blocks.

The cache logic unit 46 in FIG. 16 has an internal configuration similar to that of the cache logic unit 46 in FIG. 14. The cache operation monitor unit 51 within the cache logic unit 46 in FIG. 16 monitors, for example, the access distribution or the access interval of each of the blocks within the cache data unit 44 to generate a state signal representing a state of the cache data unit 44. The internal configuration of the cache logic unit 46 may be similar to that in FIG. 15.

As described thus far, according to the fourth embodiment, the pulse width of the write pulse to the cache memory 42 is variably controlled depending on the operating state of the processor, whereby the electric power consumption of the cache memory 42 having, for example, the MRAM can be suppressed during writing. Additionally, not only the operating state of the processor but also the operating state of the cache memory 42 is taken into account to variably control the pulse width of the write pulse to the cache memory 42. As a result, the electric power consumption of the cache memory 42 can be more efficiently suppressed without affecting the processing performance of the processor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a non-volatile memory;
   a memory controller to carry out write processing to the non-volatile memory using a write pulse; and
   a write pulse controller to select one of a first write mode for writing to the non-volatile memory and a second write mode for writing to the non-volatile memory with higher electric power consumption than the first write mode at higher speed than the first write mode and, when the first write mode is selected, set a pulse width of the write pulse such that the pulse width is shorter than one cycle of a clock signal used to control access to the non-volatile memory.

2. The semiconductor storage device according to claim 1, wherein
   the write pulse includes a first write pulse and a second write pulse having a longer pulse width than the first write pulse, and
   when the first write mode is selected, the write pulse controller selects the second write pulse as the write pulse when the pulse width of the second write pulse is shorter than one cycle of the clock signal, while selecting the first write pulse as the write pulse when the pulse width of the second write pulse is longer than one cycle of the clock signal.

3. The semiconductor storage device according to claim 2, wherein
   when the second write mode is selected, the write pulse controller selects the first write pulse as the write pulse.

4. The semiconductor storage device according to claim 1, wherein
   the write pulse controller selects the first write mode or the second write mode based on a state signal indicating an operating state of a processor.

5. The semiconductor storage device according to claim 4, wherein the write pulse controller comprises
  a pulse selector to select, based on the state signal, one pulse signal from among a plurality of pulse signals having different pulse widths from each other; and
  a voltage selector to select, based on the state signal, one voltage from among a plurality of voltages having different voltage levels from each other, and
the write pulse controller controls the write pulse based on the pulse signal selected by the pulse selector and the voltage selected by the voltage selector.

6. The semiconductor storage device according to claim 5, wherein
the non-volatile memory comprises a plurality of memory elements,
the write pulse controller comprises a transistor serially connected to each of the plurality of memory elements and to be turned on or off based on the pulse signal selected by the pulse selector, and
the voltage selected by the voltage selector is applied to the memory element corresponding to the transistor while the transistor is being turned on.

7. The semiconductor storage device according to claim 5, wherein
the write pulse controller comprises:
  a memory operation monitor to observe an operating state of the non-volatile memory,
  the pulse selector selects one pulse signal from among the plurality of pulse signals based on the state signal and observation results by the memory operation monitor, and
  the voltage selector selects one voltage from among the plurality of voltages based on the state signal and observation results by the memory operation monitor.

8. The semiconductor storage device according to claim 7, wherein
the memory operation monitor comprises:
  an access history storage to store at least one of access interval(s) of the n time(s) (where n is an integer equal to or larger than one) and an access distribution for the m time(s) (where m is an integer equal to or larger than one) to the non-volatile memory; and
  a pulse determinator to determine the pulse signal to be selected by the pulse selector, based on the state signal and the observation results including at least one of the access interval(s) of n time(s) and the access distribution for m time(s).

9. The semiconductor storage device according to claim 1, further comprising a plurality of memory blocks capable of being accessed per block and each including the non-volatile memory, wherein
the write pulse controller controls the write pulse for each of the plurality of memory blocks based on an operating state of a corresponding memory block and an operating state of a processor.

10. The semiconductor storage device according to claim 1, further comprising a cache memory, wherein
the cache memory comprises:
  a cache data storage including the non-volatile memory, the cache data storage storing cache data; and
  a tag storage including the non-volatile memory, the tag storage storing address information on the cache data, and
the write pulse controller writes data to the cache data storage and the tag storage using the write pulse.

11. The semiconductor storage device according to claim 1 further comprising a cache memory, wherein
the cache memory comprises:
  a cache data storage including the non-volatile memory, the cache data storage storing cache data; and
  a tag storage including a volatile memory, the tag storage storing address information on the cache data, and
the write pulse controller writes data to the cache data storage using the write pulse.

12. The semiconductor storage device according to claim 10, further comprising a write buffer to which data to be stored to the cache memory is stored, wherein
the write pulse controller controls the write pulse based on an occupation rate of the write buffer and a state signal indicating a state of a processor.

13. The semiconductor storage device according to claim 12, wherein
the cache memory comprises a plurality of memory blocks, and
the write pulse controller controls the write pulse to the plurality of memory blocks based on the state signal and an operating state of the plurality of memory blocks.

14. The semiconductor storage device according to claim 1, wherein
the non-volatile memory is a magnetoresistive random access memory (MRAM).

15. A processor system comprising:
a processor core;
a cache memory comprising a cache data storage and a tag storage, the cache data storage including a non-volatile memory;
a memory controller to carry out write processing to the non-volatile memory using a write pulse; and
a write pulse controller to select one of a first write mode for writing to the non-volatile memory and a second write mode for writing to the non-volatile memory with higher electric power consumption than the first write mode at higher speed than the first write mode and, when the first write mode is selected, set a pulse width of the write pulse such that the pulse width is shorter than one cycle of a clock signal used to control access to the non-volatile memory, wherein
a cache data storage stores cache data; and
a tag storage stores address information on the cache data, and
the write pulse controller writes data to the cache data storage using the write pulse.

16. The processor system according to claim 15, wherein
the tag storage comprises the non-volatile memory; and
the write pulse controller writes data to the cache data storage and the tag storage using the write pulse.

17. The processor system according to claim 15, wherein
the write pulse includes a first write pulse and a second write pulse having a longer pulse width than the first write pulse, and
when the first write mode is selected, the write pulse controller selects the second write pulse as the write pulse when the pulse width of the second write pulse is shorter than one cycle of the clock signal, while selecting the first write pulse as the write pulse when the pulse width of the second write pulse is longer than one cycle of the clock signal.

18. The processor system according to claim 17, wherein when the second write mode is selected, the write pulse controller selects the first write pulse as the write pulse.

19. The processor system according to claim 15, wherein the write pulse controller selects the first write mode or the second write mode based on a state signal indicating an operating state of a processor.

20. The processor system according to claim 19, wherein the write pulse controller comprises:
- a pulse selector to select, based on the state signal, one pulse signal from among a plurality of pulse signals having different pulse widths from each other; and
- a voltage selector to select, based on the state signal, one voltage from among a plurality of voltages having different voltage levels from each other, and the write pulse controller controls the write pulse based on the pulse signal selected by the pulse selector and the voltage selected by the voltage selector.

* * * * *